United States Patent [19]

Matsui et al.

[11] 4,353,045

[45] Oct. 5, 1982

[54] LADDER TYPE FILTER

[75] Inventors: Toshiharu Matsui, Hakui; Sasuga Kakehi, Kanazawa, both of Japan

[73] Assignee: Murata Manufacturing Co., Ltd., Japan

[21] Appl. No.: 193,184

[22] Filed: Oct. 1, 1980

[30] Foreign Application Priority Data

Oct. 9, 1979 [JP] Japan .................. 54/139990[U]

[51] Int. Cl.³ .................. H03H 9/05; H03H 9/10; H03H 9/60
[52] U.S. Cl. .................. 333/190; 333/189; 310/348
[58] Field of Search .................. 333/186–190; 310/311, 340–355; 29/25.35

[56] References Cited

U.S. PATENT DOCUMENTS 2,293,485  8/1942  Baldwin .................. 310/342 X
2,927,285  3/1960  Curran et al. .................. 333/189

FOREIGN PATENT DOCUMENTS 52-63047  5/1977  Japan .................. 333/189

*Primary Examiner*—Marvin L. Nussbaum
*Attorney, Agent, or Firm*—Ostrolenk, Faber, Gerb & Soffen

[57] ABSTRACT

A casing of a box-like shape of a rectangular parallelepiped is formed which has one side portion or each of a pair of opposing side portions formed with an opening and has a partitioning member therein. A plurality of plate like piezoelectric resonators and terminal plates are placed in the casing in parallel with the upper and bottom portions of the casing so that the same are housed in a stacked manner. The plurality of piezoelectric resonators and terminal plates as housed are partitioned into two groups by means of the partitioning member. Accordingly, the height of the casing is determined by the thickness of each plate like piezoelectric resonator and the number of the resonators, with the result that the height of the casing can be decreased to be a thin type. A blocking member or members are provided to one opening or two opposing openings formed on the side portion or portions. The piezoelectric resonators and terminal plates are blocked by the blocking member from being slipped out from the casing.

13 Claims, 19 Drawing Figures

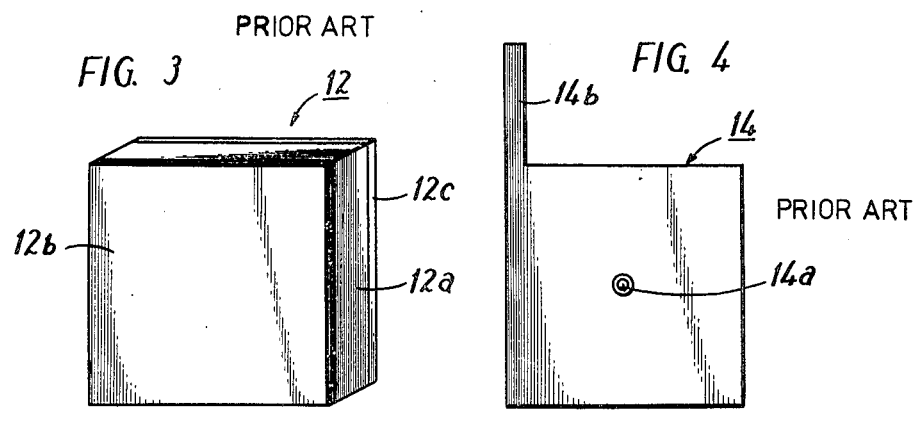
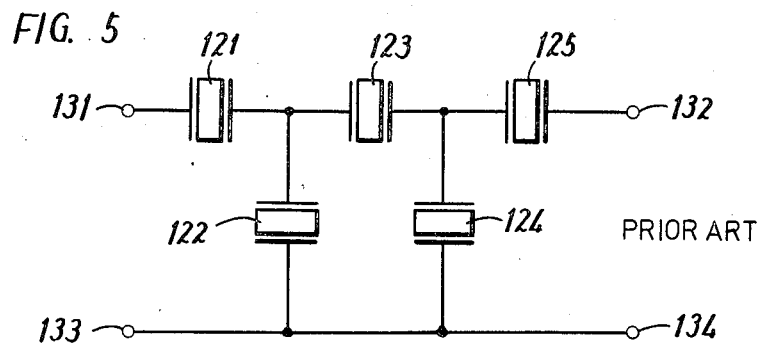
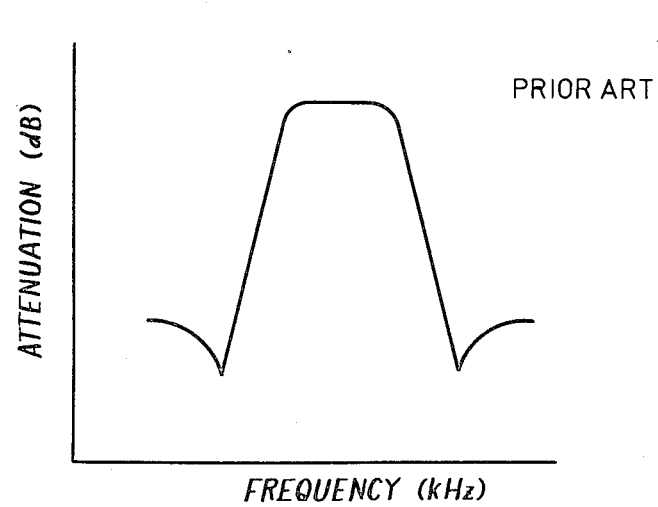

LADDER TYPE FILTER

BACKGROUND OF THE INVENTION

1. Field of the Invention

The present invention relates to a ladder type filter. More specifically, the present invention relates to such ladder type filter that comprises a plurality of piezoelectric resonators disposed in two columns in a casing.

2. Description of the Prior Art

FIG. 1 is a perspective view of a casing for constituting a ladder type filter, which constitutes the background of the invention. FIG. 2A is a plan view showing a plurality of piezoelectric resonators housed in the FIG. 1 casing. FIG. 2B is a longitudinal sectional view taken along the line IIB—IIB in FIG. 2A. FIG. 3 is a perspective view showing a piezoelectric resonator included in the FIG. 2A ladder type filter. FIG. 4 is a view showing one example of a terminal plate for electrically connecting a plurality of piezoelectric resonators included in the FIG. 2A ladder type filter. FIG. 5 is an equivalent circuit diagram of a ladder type filter which constitutes the background of the invention. FIG. 6 is a view showing a bandpass characteristic of a ladder type filter which constitutes the background of the invention.

Now referring to FIGS. 1 to 6, a conventional ladder type filter will be described. A casing 11 of a rectangular parallelepiped is made of synthetic resin. The upper portion of the casing 11 is formed with an opening. The casing 11 is also provided with an input terminal 131, an output terminal 132 and ground terminals 133 and 134 at four corners thereof. A plurality of piezoelectric resonators 121–125 are housed in the casing 11. As shown in FIG. 3, each piezoelectric resonator (referred to generally as resonator 12) comprises a square piezoelectric body 12a and electrode films 12b and 12c formed on the entire surface of both major surfaces. Alternatively, the electrode films 12b and 12c each may be formed only at the central portion of the piezoelectric body 12a. Piezoelectric resonators 121, 123 and 125 are relatively thick and piezoelectric resonators 122 and 124 are relatively thin. By thus differently selecting the thickness of the piezoelectric vibrators, a capacitance ratio is achieved between the respective piezoelectric resonators 12 and hence the maximum amount attenuation of the filter can be improved.

Furthermore, a plurality of terminal plates 141 to 150 are prepared for the purpose of electrically connecting piezoelectric resonators 121 to 125. As shown in FIG. 4, each terminal plate (referred to generally as plate 14) is formed in substantially the same square shape as that of the piezoelectric resonator 12. A protruding portion 14a is formed at the central portion of the terminal plate 14 so as to be in contact with the electrode film of the respective piezoelectric resonator 121 to 125 to which it is connected. A portion of the terminal plates 14 out of the plurality of terminal plates 14 have strip like connecting portions 14b formed extending outward from one side end thereof. The connecting portions 14b are used for connection to the input terminal 131 and other terminal plates 14.

The above described piezoelectric resonators 121, 123 and 125 of a relatively large thickness and the piezoelectric resonators 122 and 124 of a relatively small thickness are alternately disposed so that the respective major surfaces face each other. The piezoelectric resonators 121 to 125 are electrically connected by means of the terminal plates 141 to 150. More specifically, the electrode film of one major surface of the piezoelectric resonator 121 is in contact with the terminal plate 141 and the terminal plate 141 is connected to the input terminal 131 through the connecting portion thereof. The electrode film on the other major surface of the piezoelectric resonator 121 is connected to the electrode film on one major surface of the piezoelectric resonator 122 by means of the terminal plates 142 and 143. The electrode film on the other major surface of the piezoelectric resonator 122 is in contact with the terminal plate 144 and the terminal plate 144 is connected to a ground bar 18. An insulating spacer 151 is interposed between the terminal plates 144 and 145 for the purpose of electrically insulating the same. The terminal plate 145 is in contact with the electrode film on one major surface of the piezoelectric resonator 123 and is connected to the above described terminal plate 142. The electrode film on the other major surface of the piezoelectric resonator 123 is connected to the electrode film on one major surface of the piezoelectric resonator 124 by means of the terminal plates 146 and 147. The electrode film on the other major surface of the piezoelectric resonator 124 is in contact with the terminal plate 148 and the terminal plate 148 is connected to the ground bar 18. An insulating spacer 152 is disposed between the terminal plates 148 and 149 for the purpose of electrically insulating the same. The terminal plate 149 is in contact with the electrode film on one major surface of the piezoelectric resonator 125 and is connected to the above described terminal plate 146. The electrode film on the other major surface of the piezoelectric resonator 125 is in contact with the terminal plate 150 and the terminal plate 150 is connected to the output terminal 132.

Thus, the respective piezoelectric resonators 121 to 125 and the terminal plates 141 to 150 housed in the casing 11 are blocked by means of a blocking member 16 for blocking the resonators from slipping out of the casing 11. In other words, the blocking member 16 is selected to be of the same length as that of the casing 11 in which the piezoelectric resonators 121 to 125 are arranged and is formed with protruding portions 161 and 162 at both end portions thereof. On the other hand, a pair of opposing side portions of the casing 11 are formed with recesses 111 and 112 so that the above described protruding portions 161 and 162 of the blocking member 16 may fit thereinto. When the protruding portions 161 and 162 of the blocking member 16 are fitted in the recesses 111 and 112 of the casing 11, the piezoelectric resonators 121 to 125 and the terminal plates 141 to 150 are blocked by the blocking member 16 from slipping out of the casing 11.

An equivalent electric circuit diagram of the ladder type filter 1 thus structured is shown in FIG. 5, in which the three piezoelectric resonators 121, 123 and 125 are connected in series between the input terminal 131 and the output terminal 132, while the piezoelectric resonator 122 is connected between the junction of the piezoelectric resonators 121 and 123 and the ground terminals 133 and 134 and the piezoelectric resonator 124 is connected between the junction of the piezoelectric resonators 123 and 125 and the ground terminals 133 and 134. The bandpass characteristic of such ladder type filter 1 is shown in FIG. 6, wherein the curve is relatively high in the middle frequency region, with the intermediate frequency of 455 kHz approximately at the center, and the curve abruptly falls at the higher and lower regions.

Meanwhile, with the thus structured conventional ladder type filter 1, it was the most common approach to provide an opening on the upper portion of the casing in order to facilitate housing of the piezoelectric resonators 121 to 125 and to facilitate connection between the terminal plates 141 and the input terminal 131. However, formation of an opening on the upper portion of the casing 11 makes it necessary that the connection between the terminal plates 142 and 145, the connection between the terminal plates 146 and 149 and the connection between the terminal plates 144 and 148 and the ground bar 18 all occur on the upper portion of the casing 11, which increases the height of the casing 11. Furthermore, since it is necessary to fix the blocking member 16 on the upper portion of the casing 11 so that the piezoelectric resonators 121 to 125 are prevented from slipping out of the casing 11, provision of the blocking member 16 further increases the total height of the housing.

Furthermore, the size of the casing 11 is also determined by the geometery of the piezoelectric resonators 121 to 125 being housed therein. Therefore, miniaturization of the casing 11 is restricted by the size of the piezoelectric resonators 121 to 125. More specifically, the length of the casing 11 in the direction in which the piezoelectric resonators 121 to 125 are arranged could be reduced by decreasing the thickness of the piezoelectric resonators 121 to 125 and by decreasing the thickness of the terminal plates 141 to 150. Nevertheless, an excessive decrease of the thickness of the piezoelectric resonators 121 to 125 decreases a mechanical strength thereof, resulting in fragility and degraded reliability.

Furthermore, the height of the casing 11 was not able to be decreased, without decreasing the resonance frequency of the piezoelectric resonators 121 to 125, thereby to decrease the bulkiness thereof.

SUMMARY OF THE INVENTION

For the purpose of eliminating the above described problems and shortcomings, the present invention comprises a casing of a box-like shape having an opening formed on the side portion thereof and a partitioning member formed inside thereof, a plurality of piezoelectric resonators inserted in the casing through the opening and arranged at least in two columns partitioned by the partitioning member, and a blocking member blocking the opening for preventing the piezoelectric resonators from slipping out of the casing.

With attention paid to the fact that an increased ratio of occupation of connecting means for connecting terminal plates and an input terminal with respect to the total height is an obstacle to miniaturization, the present invention comprises connecting means provided not on the upper portion but on the side portion of the casing. Formation of the opening on the upper portion of the casing as done conventionally degrades work efficiency of connection by means of the connecting means. Therefore, for the purpose of improving work efficiency, the present invention comprises an opening formed on the side portion of the casing. The blocking member is also provided on the side portion, i.e. on the portion where the opening is formed, in accord with the formation of the opening on the side portion. Therefore, according to the present invention, no consideration need be given to the height component of the connecting means nor to the height component of the blocking member, as compared with a conventional ladder type filter, and as a result the total height of the filter can be decreased.

In a preferred embodiment of the present invention, a plurality of piezoelectric resonators are stacked with the terminal plates interposed therebetween, so that the plane of the piezoelectric resonators may be in parallel with the upper and bottom portions of the casing, while the plurality of piezoelectric resonators are disposed in at least two columns separated by the partitioning member. Connection of the terminal plates and the input terminal is made on the side portion. Furthermore, predetermined piezoelectric resonators of the respective columns are connected by means of the connection electrodes which run over the partitioning member. Accordingly, the height of the casing is determined by the thickness of the plurality of piezoelectric resonators and the number of resonators and hence the total height of the inventive filter can be approximately halved as compared with a conventional ladder type filter. In addition, since predetermined piezoelectric resonators are internally connected, external connection is not required, which further eliminates necessity of external connection when the inventive ladder type filter is installed on a print circuit board, for example.

Accordingly, a principal object of the present invention is to provide an improved ladder type filter, in which the total height can be decreased to be a thin type.

Another object of the present invention is to provide a ladder type filter, wherein compactness can be achieved without degrading reliability.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a perspective view of a piezoelectric resonator included in the FIG. 2A ladder type filter;

FIG. 4 is a view of a terminal plate included in the FIG. 2A ladder type filter;

FIG. 5 is an equivalent circuit diagram of a ladder type filter which constitutes the background of the invention;

FIG. 6 is a graph showing a bandpass characteristic of a conventional ladder type filter;

DESCRIPTION OF THE PREFERRED EMBODIMENT

Figure 7:
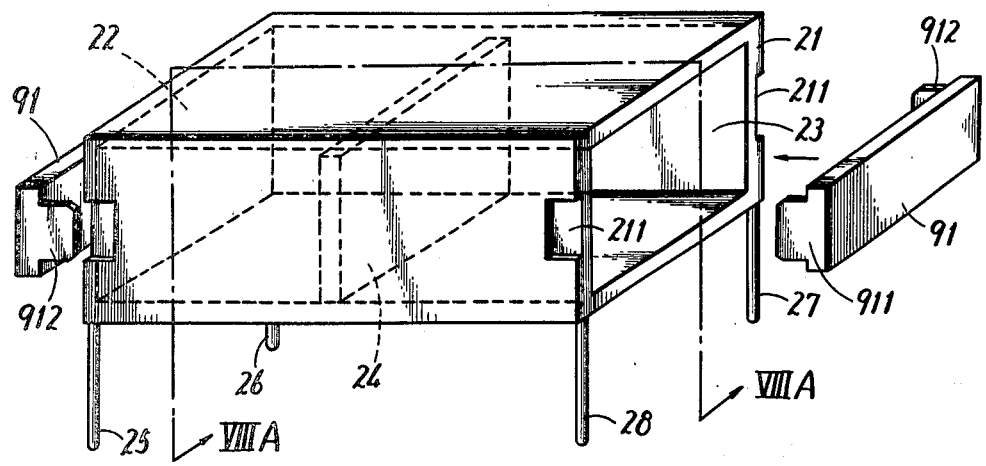
FIG. 7 is a view of a casing for use in one embodiment of the present invention.
Figure 9:
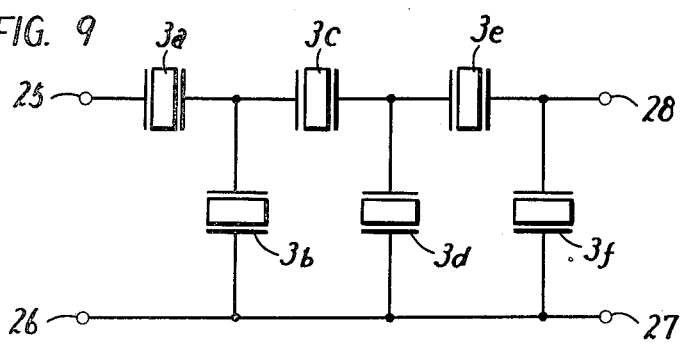
FIG. 9 is an equivalent circuit diagram of the FIG. 8A embodiment of the present invention.
Figure 8A:
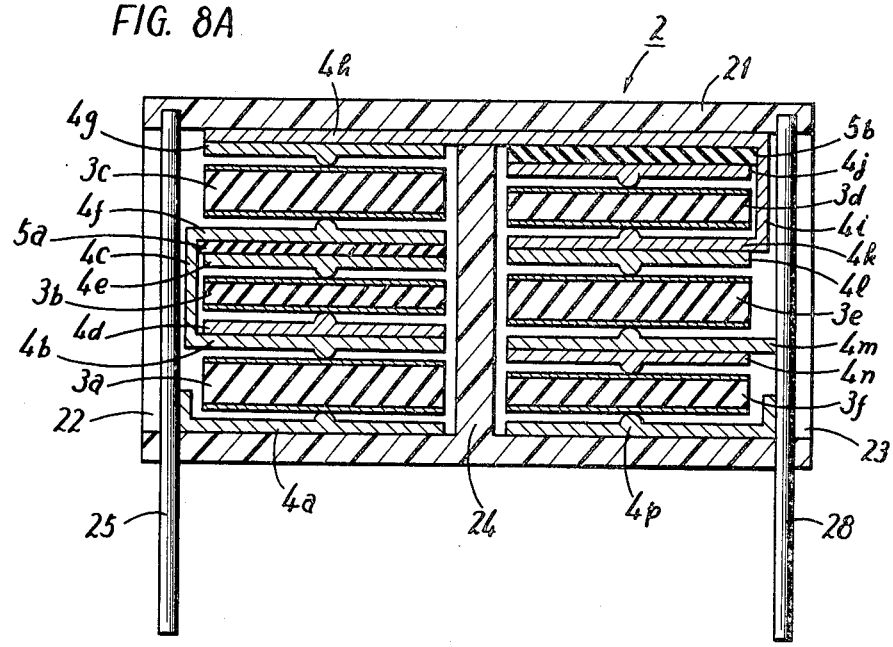
FIG. 8A is a longitudinal sectional view taken along the line VIIIA—VIIIA with piezoelectric resonators housed in the FIG. 7 casing.
Figure 8B:
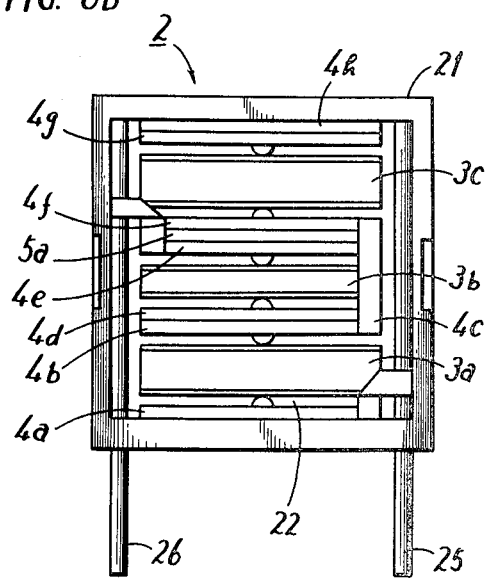
FIG. 8B is a left side view of the FIG. 8A embodiment of the present invention.
Figure 8C:
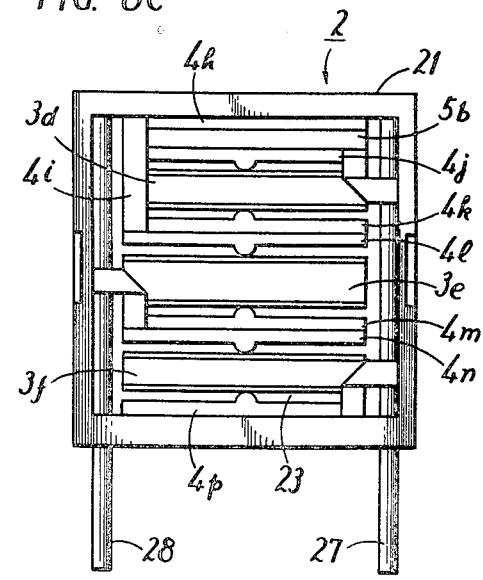
FIG. 8C is a right side view of the FIG. 8A embodiment of the present invention.

FIG. 7 is a view of a casing for use in one embodiment of the present invention. FIG. 8A is a longitudinal sectional view taken along the line VIIIA—VIIIA in FIG. 7. FIGS. 8B and 8C are a left side view and a right side view of the FIG. 7 embodiment. FIG. 9 is an equivalent circuit diagram of the FIG. 7 embodiment.

Figure 1:
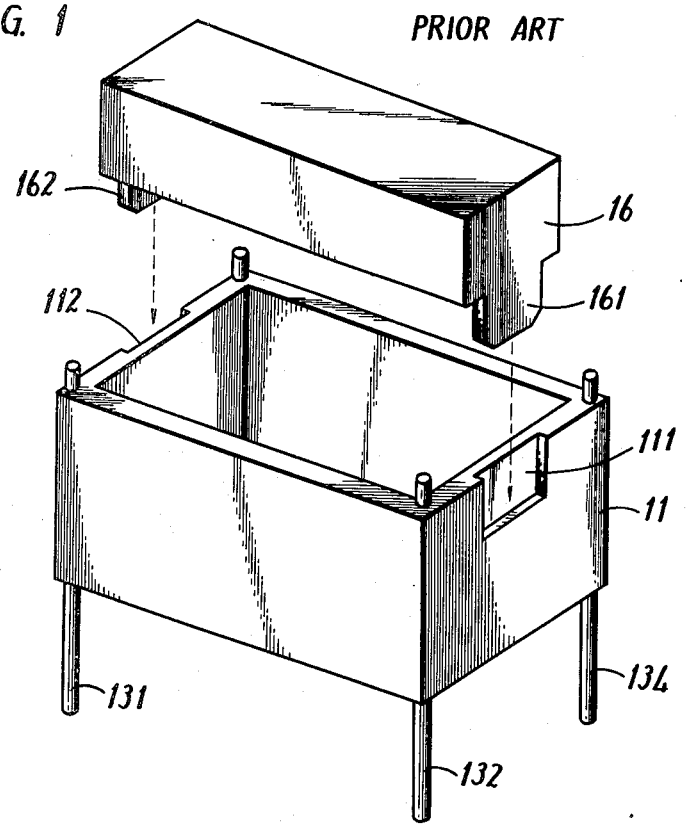
FIG. 1 is a perspective view of a casing for constituting a ladder type filter which constitutes the background of the invention.

Now referring to FIGS. 7 to 9, a specific structure of the above described embodiment will be described. A casing 21 having a box-like shape of a rectangular parallelepiped is made of synthetic resin. Openings 22 and 23 are formed on a pair of opposing side portions of the casing 21. A partitioning member 24 is formed within the casing 21 for dividing the internal space into two compartments. An input terminal 25, ground terminals 26 and 27 and an output terminal 28 are provided at four corners of the casing 21. A blocking member 91 of substantially the same shape as that of the blocking member 16 shown in FIG. 1 is provided in a different length. Recesses 211 for fitting protruding portions 911 and 912 of the blocking members 91 are formed on the side portions adjacent to the openings 22 and 23 of the casing 21.

Figure 2A:
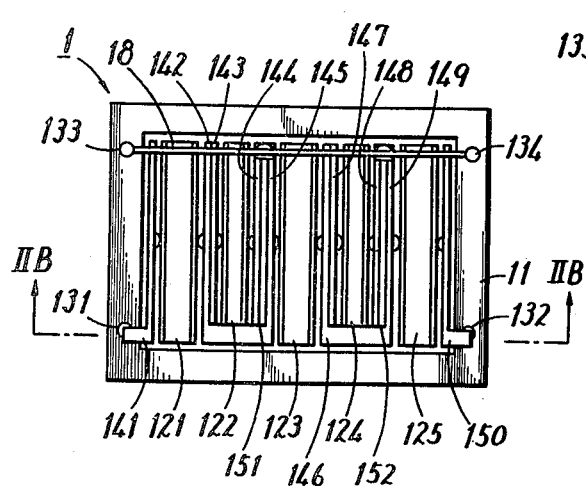
FIG. 2A is a plan view of a ladder type filter which constitutes the background of the invention.
Figure 2B:
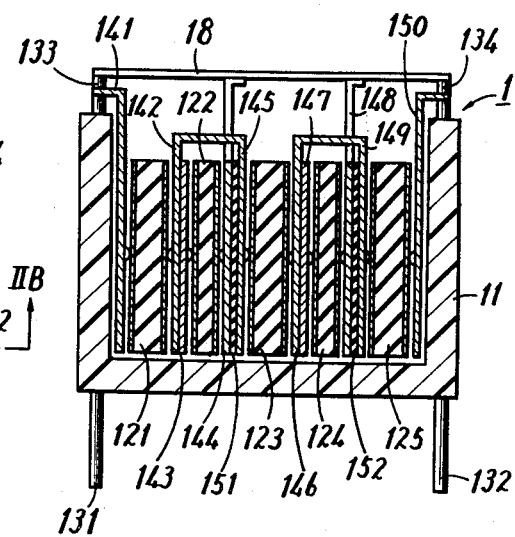
FIG. 2B is a longitudinal sectional view taken along the line IIB—IIB in FIG. 2A.

A plurality of piezoelectric resonators 3a to 3c and 3d to 3f as stacked and electrically connected by means of the terminal plates 4a to 4h, and 4h to 4p, respectively are inserted through the openings 22 and 23, respectively and housed in the casing 21. The piezoelectric resonators 3a to 3f are formed in the same manner as previously described in conjunction with FIGS. 2A, 2B and 3 and thus two kinds of the piezoelectric resonators of different thicknesses are prepared. The terminal plates 4a, 4b, 4d, 4e, 4f, 4g, 4j, 4k, 4l, 4m, 4n and 4p are formed in substantially the same square shape as that of the piezoelectric resonators 3a to 3f. These terminal plates 4a to 4p are each formed with a protruding portion to be in contact with the electrode film of the respective piezoelectric resonators 3a to 3f at the approximate central portion of them, as in the case of FIG. 4. These terminal plates 4a to 4p are each also formed with a connecting portion extending outward from one side end of each thereof.

Now arrangement of the above described piezoelectric resonators 3a to 3f and the terminal plates 4a to 4p will be described in more detail. The terminal plate 4a is disposed at the lowermost portion of the opening 22 and the terminal plate 4a is connected to the input terminal 25. The terminal plate 4a is in contact with the electrode film on one major surface of the relatively thick piezoelectric resonator 3a and the electrode film on the other major surface of the piezoelectric resonator 3a is connected to the electrode film on one major surface of the relatively thin piezoelectric resonator 3b through the terminal plates 4b and 4d. The electrode film on the other major surface of the piezoelectric resonator 3b is connected to the terminal plate 4e and the terminal plate 4e is connected to the ground terminal 26. The terminal plate 4f is disposed on the terminal plate 4e through the insulating spacer 5a. The terminal plate 4f is connected to the electrode film on one major surface of the relatively thick piezoelectric resonator 3c and is connected to the above described terminal plate 4b by means of the connecting portion 4c. The electrode film on the other major surface of the above described piezoelectric resonator 3c is in contact with the terminal plate 4g and the terminal plate 4g is connected to the terminal plate 4k at the side of the opening 23 by means of the connecting terminal plate 4h.

The terminal plate 4p is disposed on the lowermost portion at the side of the opening portion 23 and the terminal plate 4p is connected to the ground terminal 27. The terminal plate 4p is in contact with the electrode film on one major surface of the relatively thin piezoelectric resonator 3f and the electrode film on the other major surface of the piezoelectric resonator 3f is in contact with the electrode film on one major surface of the relatively thick piezoelectric resonator 3e through the terminal plates 4n and 4m. The terminal plate 4m is connected to the output terminal 28. The electrode film on the other major surface of the above described piezoelectric resonator 3e is connected to the electrode film on one major surface of the relatively thin piezoelectric resonator 3d through the terminal plates 4l and 4k. The electric film on the other major surface of the piezoelectric resonator 3d is connected to the ground terminal 27 through the terminal plate 4j. The insulating spacer 5b is interposed between the terminal plates 4j and 4h for the purpose of insulation. Accordingly, the ladder type filter 2 shown in FIG. 7 comprises an equivalent circuit diagram as shown in FIG. 9, in which the piezoelectric resonators 3a, 3b and 3c are connected in series, while the piezoelectric resonator 3b is connected in shunt between the junction of the piezoelectric resonators 3a and 3c and the ground terminals 26 and 27, the piezoelectric resonator 3d is connected in shunt between the junction of the piezoelectric resonators 3c and 3e and the ground terminals 26 and 27, and the piezoelectric resonator 3f is connected in shunt between the piezoelectric resonator 3e and the output terminal 28 and the ground terminals 26 and 27.

Meanwhile, the ground terminals 26 and 27 of the above described ladder type filter 2 are properly interconnected. For example, a connecting terminal plate may be provided for the purpose of connecting the ground terminals 26 and 27 through an insulating spacer, not shown, over the connecting plate terminal 4h.

After the piezoelectric resonators 3a to 3f, and the terminal plates 4a to 4p are thus housed in the casing 21, the blocking members 91 are fixed on the respective openings 22 and 23. The blocking members 91 serve to block the piezoelectric resonators and terminal plates from being slipping out of casing 21. Meanwhile, alternatively the recesses 211 may be formed on the upper and bottom portions of the casing adjacent to the openings 22 and 23.

Figure 10A:
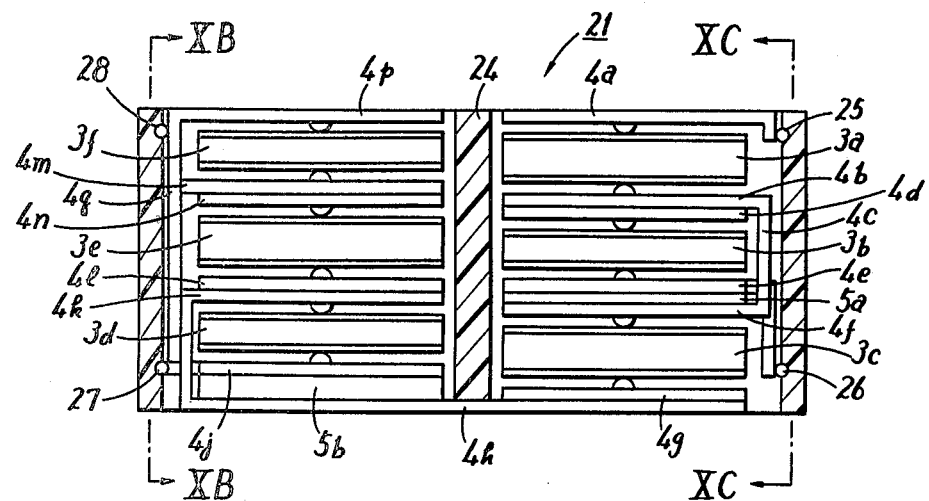
FIG. 10A is a transversal sectional view of another embodiment of the present invention.
Figure 10B:
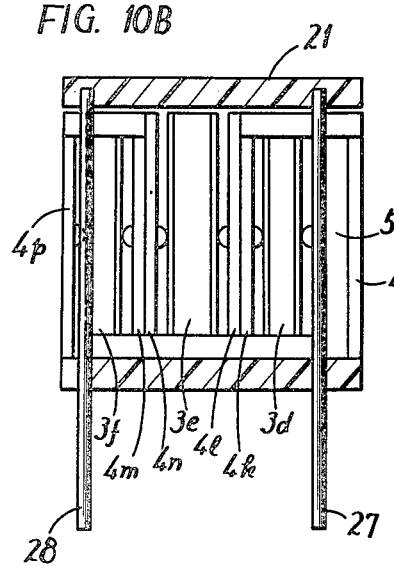
FIG. 10B is a longitudinal sectional view taken along the line XB—XB in FIG. 10A.
Figure 10C:
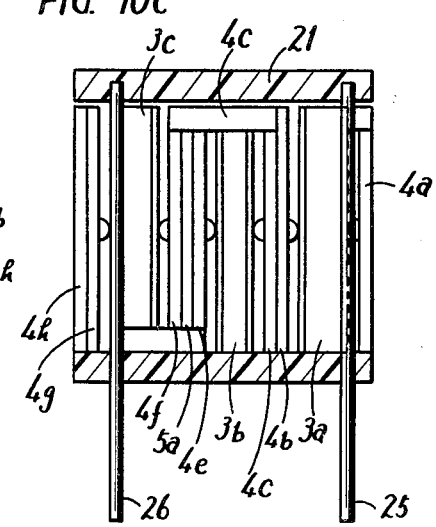
FIG. 10C is a longitudinal sectional view taken along the XC—XC in FIG. 10A.

FIG. 10A is a transversal sectional view of another embodiment of the present invention. FIG. 10B is a right side sectional view taken along the line XB—XB in FIG. 10A. FIG. 10C is a left side sectional view taken along the line XC—XC in FIG. 10A.

FIG. 10A shows the piezoelectric resonators 3a, 3b and 3c, as stacked, and the piezoelectric resonators 3d, 3e and 3f as stacked, which are disposed in the casing 21 such that the plane of the resonators extend in the direction orthogonal to the bottom portion of the casing 11. More specifically, the terminal plate 4a, the piezoelectric resonator 3a, the terminal plates 4b and 4d, the piezoelectric resonator 3b, the terminal plate 4e, the insulating spacer 5a, the terminal plate 4f, the piezoelectric resonator 3c, and the terminal plates 4g and 4h are stacked and placed in one of the compartments partitioned by the partitioning member 24 of the casing 21, such that the plane of the resonators and plates extend in the direction orthogonal to the bottom portion of the casing 21, and the terminal plate 4p, the piezoelectric resonator 3f, the terminal plates 4m and 4n, the piezoelectric resonator 3e, the piezoelectric plates 4l and 4k, the piezoelectric resonator 3d, the terminal plate 4j, the insulating spacer 5b and the terminal plate 4h are stacked and placed in the other of the compartments partitioned by the partitioning member 24, such that the plane of the resonators and plates also extend in the direction orthogonal to the bottom plate of the casing 21.

The terminal plate 4a is connected to the input terminal 25 and the terminal plate 4m is connected to the output terminal 28. The terminal plates 4b and 4f are connected by means of the connecting portion 4c. The terminal plate 4e is connected to the ground terminal 26. The terminal plates 4h and 4k are connected by means of the connecting portion 4i. Furthermore, the terminal plate 4p is connected to the ground terminal 27 by means of the connecting portion 4q. The terminal plate 4j is connected to the ground terminal 27.

Figure 11:
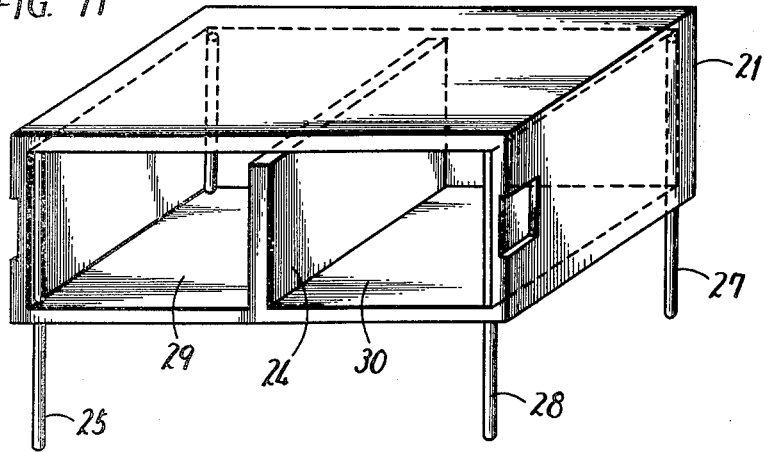
FIG. 11 is a view showing a casing for use in the FIG. 10A embodiment.

FIG. 11 is a view showing a further embodiment of the present invention. The FIG. 11 embodiment comprises the casing 21 having an opening on one side portion orthogonal to the partitioning member 24 dividing the inside of the casing 21, whereby two openings 29 and 30 are formed. The stacked piezoelectric resonators 3a to 3f and terminal plates 4a to 4p, as shown in FIGS. 8A and 10A, are inserted into the housing 21 through these openings 29 and 30. The blocking member 91 as shown in FIG. 7 is fixed to the openings 29 and 30. Meanwhile, since the openings 29 and 30 are formed on the same side portion of the casing 21 in the FIG. 11 embodiment, it is sufficient to provide only one blocking member 91.

Figure 12:
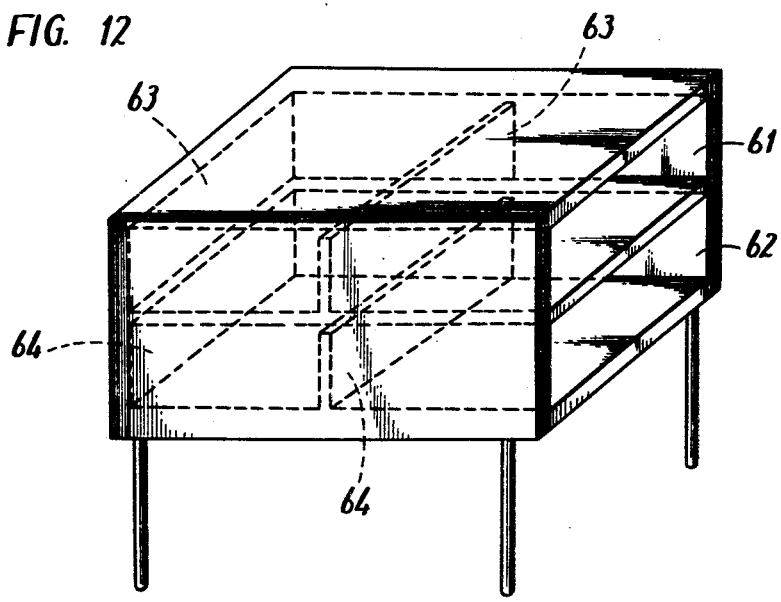
FIG. 12 is a view showing a casing for use in a further embodiment of the present invention.

FIG. 12 is a view showing still a further embodiment of the present invention. The FIG. 12 embodiment comprises the casings 21 as shown in FIG. 7, as stacked, having the openings 61, 62, 63 and 64 at both side portions of the casings 21. Each casing is used for housing the piezoelectric resonators 3a to 3f and the terminal plates 4a to 4b, as stacked, as shown in FIGS. 8A and 10A. Meanwhile, the opening may be formed on a portion of the casing perpendicular to the partitioning members 63 and 64.

Figure 13:
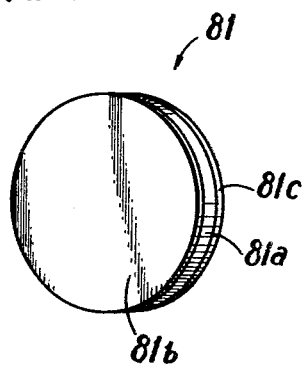
FIG. 13 is a perspective view of a modification of a piezoelectric resonator for use in the embodiment of the present invention.

FIG. 13 is a view of a modification of a piezoelectric resonator for use in the embodiment of the present invention. The FIG. 13 resonator comprises a piezoelectric resonator 81 in a disk shape, as compared with the FIG. 3 resonator 12 in a square shape. More specifically, the piezoelectric resonator 81 comprises a disk shaped piezoelectric body 81a, and electrodes 81b and 81c formed on both major surfaces thereof.

Figure 14:
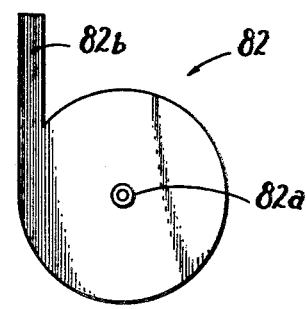
FIG. 14 is a front view of a terminal plate for use with the FIG. 13 modification of the piezoelectric resonator.

FIG. 14 is a view showing a modification of a terminal plate for use with the FIG. 13 piezoelectric resonator. More specifically, the FIG. 14 terminal plate is used for connecting the FIG. 13 piezoelectric resonator 81 and hence is shaped in substantially the same disk shape as that of the piezoelectric resonator 81. A protruding portion 82a to be in contact with the electrode film of the piezoelectric resonator 81 is formed at the approximate central portion of the terminal plate 81 and a connecting portion 82b is formed extending outward from the periphery thereof. The disk shaped piezoelectric resonators 81 and the disk shaped terminal plate 82 are stacked and are housed in a casing as shown in FIGS. 7, 11 and 12.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A ladder type filter, comprising:
   a casing having a box-like shape and having a top portion, a bottom portion and at least one side portion;
   first and second sets of plate-like piezoelectric resonators, each of the resonators in a said set of resonators being stacked with respect to one another and housed in said casing;
   said casing having at least one opening on the side portion and a partitioning member therein for partitioning the inside of said casing into first and second compartments;
   said first and second sets of piezoelectric resonators being located in said first and second compartments, respectively, each said set of resonators forming a column of resonators in its respective said compartment; and
   blocking means at least partially blocking said at least one opening for preventing said first and second sets of piezoelectric resonators from slipping out of said casing.

2. A ladder type filter in accordance with claim 1, wherein at least one resonator of said first set is coupled to at least one other resonator of said first set by one or more first set connectors and at least one resonator of said second set is coupled to at least one resonator of said second set by one or more second set connectors, and wherein said first and second set connectors are located at the side portion of said casing such that the height of said casing as measured between said top and bottom portions is independent of said first and second set connectors.

3. A ladder type filter in accordance with claim 1 or 2, wherein each of said resonators has opposed major planar surfaces and wherein said opposed major surfaces are oriented parallel with said bottom portion of said casing.

4. A ladder type filter in accordance with claim 1 or 2, wherein each of said resonators has opposed major planar surfaces and wherein said opposed major planar surfaces are oriented to extend orthogonal to said bottom portion of said casing.

5. A ladder type filter in accordance with claim 3, wherein:
   said at least one opening comprises first and second openings formed respectively on each of a pair of opposing side portions of said casing, said partitioning member being parallel to said opposing side portions; and said blocking means comprises first and second blocking members, each said blocking member blocking a respective said opening.

6. A ladder type filter in accordance with claim 3, wherein:
said casing has said opening on one side portion which is orthogonal to said partitioning member; and
said blocking means comprises a blocking member blocking said one opening.

7. A ladder type filter in accordance with claim 3, further comprising a plurality of terminal plates each disposed between a respective pair of said piezoelectric resonators.

8. A ladder type filter in accordance with claim 3, which further comprises a connecting plate for connecting one or more piezoelectric resonators of said first set with one or more piezoelectric resonators in said second set, said connecting plate extending over said partitioning member of said casing.

9. A ladder type filter in accordance with claim 4, wherein:
said at least one opening comprises first and second openings formed respectively on each of a pair of opposing side portions of said casing, said partitioning member being parallel to said opposing side portions; and
said blocking means comprises first and second blocking members, each said blocking member blocking a respective said opening.

10. A ladder type filter in accordance with claim 4, wherein:
said casing has said opening on one side portion which is orthogonal to said partitioning member; and
said blocking means comprises a blocking member blocking said one opening.

11. A ladder type filter in accordance with claim 4, which further comprises a connecting plate for connecting one or more piezoelectric resonators of said first set with one or more piezoelectric resonators in said second set, said connecting plate extending over said partitioning member of said casing.

12. A ladder type filter in accordance with claim 1, wherein:
said blocking means comprises a blocking member having first and second protruding portions located at opposite ends thereof; and
said casing includes first and second recesses for receiving said first and second protruding portions, respectively, of said blocking member, said recesses being located at those side portions of said casing located adjacent to said side portion where said opening is formed.

13. A ladder type filter in accordance with claim 1, wherein
said casing comprises at least two casing units, as stacked, each housing a plurality of piezoelectric resonators as stacked.

* * * * *